United States Patent
Lee et al.

(10) Patent No.: US 10,283,533 B2
(45) Date of Patent: May 7, 2019

(54) TRANSISTOR ARRAY PANEL INCLUDING TRANSISTOR WITH TOP ELECTRODE BEING ELECTRICALLY CONNECTED TO SOURCE ELECTRODE AND MANUFACTURING METHOD THEREOF

(71) Applicant: SAMSUNG DISPLAY CO., LTD., Yongin-si, Gyeonggi-do (KR)

(72) Inventors: Sang Kyung Lee, Asan-si (KR); Sang-Ho Moon, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/344,084

(22) Filed: Nov. 4, 2016

(65) Prior Publication Data
US 2017/0179158 A1  Jun. 22, 2017

(30) Foreign Application Priority Data
Dec. 16, 2015  (KR) .................. 10-2015-0180450

(51) Int. Cl.
| H01L 27/12 | (2006.01) |
| H01L 27/32 | (2006.01) |
| H01L 21/44 | (2006.01) |
| H01L 29/417 | (2006.01) |
| H01L 29/423 | (2006.01) |
| H01L 29/786 | (2006.01) |

(52) U.S. Cl.
CPC ............ *H01L 27/124* (2013.01); *H01L 21/44* (2013.01); *H01L 27/1225* (2013.01); *H01L 27/1248* (2013.01); *H01L 27/1288* (2013.01); *H01L 27/3262* (2013.01); *H01L 29/41733* (2013.01); *H01L 29/42384* (2013.01); *H01L 29/7869* (2013.01); *H01L 29/78648* (2013.01)

(58) Field of Classification Search
CPC ............... H01L 27/124; H01L 27/1248; H01L 27/1288; H01L 27/7869; H01L 21/44; H01L 29/41733; H01L 29/42384; H01L 27/3262; H01L 29/78648
See application file for complete search history.

(56) References Cited

U.S. PATENT DOCUMENTS

| 2003/0230748 A1* | 12/2003 | Shih ............... G02F 1/136209 257/59 |
| 2008/0050851 A1* | 2/2008 | Tanaka .............. H01L 21/76802 438/29 |
| 2010/0207033 A1* | 8/2010 | Chen ................ H01L 31/085 250/370.11 |

(Continued)

FOREIGN PATENT DOCUMENTS

| KR | 10-1108176 | 1/2012 |
| KR | 10-2013-0124506 | 11/2013 |

(Continued)

*Primary Examiner* — Victoria K. Hall
(74) *Attorney, Agent, or Firm* — F. Chau & Associates, LLC (57) ABSTRACT

A transistor array panel includes a transistor disposed on a substrate. The transistor includes a gate electrode, a source electrode, a drain electrode, a semiconductor, and a top electrode. The top electrode is disposed on and overlaps the semiconductor, and is electrically connected to the source electrode.

11 Claims, 8 Drawing Sheets

(56) References Cited

U.S. PATENT DOCUMENTS

| | | | |
|---|---|---|---|
| 2011/0127521 A1* | 6/2011 | Yamazaki | H01L 29/78693 257/43 |
| 2011/0286256 A1* | 11/2011 | Kamata | G11C 11/404 365/72 |
| 2012/0256184 A1* | 10/2012 | Kaneko | H01L 29/78621 257/59 |
| 2012/0280238 A1* | 11/2012 | Kimura | H01L 27/1225 257/59 |
| 2013/0032803 A1* | 2/2013 | Moon | H01L 51/5271 257/59 |
| 2013/0334533 A1* | 12/2013 | Yamazaki | H01L 29/7869 257/57 |
| 2014/0103339 A1* | 4/2014 | Yamazaki | H01L 29/78693 257/43 |
| 2014/0138772 A1* | 5/2014 | Na | H01L 29/518 257/347 |
| 2016/0005767 A1* | 1/2016 | Shen | G02F 1/136286 257/72 |
| 2016/0307932 A1* | 10/2016 | Ge | H01L 21/02565 |
| 2017/0018577 A1* | 1/2017 | Matsuda | H01L 29/7869 |
| 2017/0108722 A1* | 4/2017 | Gao | G02F 1/1368 |

FOREIGN PATENT DOCUMENTS

| | | |
|---|---|---|
| KR | 10-2015-0037795 | 4/2015 |
| KR | 10-2015-0051824 | 5/2015 |

\* cited by examiner

TRANSISTOR ARRAY PANEL INCLUDING TRANSISTOR WITH TOP ELECTRODE BEING ELECTRICALLY CONNECTED TO SOURCE ELECTRODE AND MANUFACTURING METHOD THEREOF

CROSS-REFERENCE TO RELATED APPLICATION

This application claims priority under 35 U.S.C. § 119 from, and the benefit of, Korean Patent Application No. 10-2015-0180450, filed in the Korean Intellectual Property Office on Dec. 16, 2015, the contents of which are herein incorporated by reference in their entirety.

BACKGROUND (a) Technical Field

Embodiments of the present disclosure are directed to a transistor array panel and a manufacturing method thereof.

(b) Discussion of the Related Art

Transistors are included in various electronic devices such as a display device, and include a gate electrode, a source electrode, a drain electrode, and a semiconductor. A transistor can be used as a switching element or a driving element for the display device.

The semiconductor determines characteristics of the transistor. Silicon (Si) is generally used for the semiconductor. Silicon (Si) can be classified as amorphous silicon or polysilicon, depending on crystal patterns. Amorphous silicon has a simple manufacturing process but a low charge mobility, so is rarely used in high-performance transistors, while polysilicon has high charge mobility but requires a process for crystallizing the silicon, so its product cost is high and its manufacturing process is complicated. Recently, a thin film transistor using an oxide semiconductor that has a high charge mobility and a high ON/OFF current ratio as compared with amorphous silicon, in addition to having a low cost and high uniformity compared with polysilicon, has been studied.

SUMMARY

Embodiments of the present disclosure can provide improved transistor characteristics.

Embodiments of the present disclosure can reduce the number of masks and processing stages used for manufacturing a transistor array panel, and improve the quality of a transistor array panel.

An exemplary embodiment of the present disclosure provides a transistor array panel that includes a transistor disposed on a substrate. The transistor includes a gate electrode, a source electrode, a drain electrode, a semiconductor, and a top electrode. The top electrode is disposed on and overlaps the semiconductor, and is electrically connected to the source electrode.

The semiconductor may be disposed on the gate electrode.

The transistor array panel may further include a first insulating layer disposed between the gate electrode and the semiconductor, and an insulator disposed between the semiconductor and the top electrode. The first insulating layer may be thinner than the insulator.

The first insulating layer may have a thickness of less than or equal to about 2,000 angstroms and the insulator may have a thickness of greater than or equal to about 3,000 angstroms.

The transistor array panel may further include a second insulating layer disposed on the transistor and the top electrode. The second insulating layer may include a first contact hole that exposes the source electrode, a second contact hole that exposes the drain electrode, and a third contact hole that exposes the top electrode.

The transistor array panel may further include: a first connector disposed on the second insulating layer that is electrically connected to the source electrode through the first contact hole; a second connector disposed on the second insulating layer that is electrically connected to the drain electrode through the second contact hole; and a third connector disposed on the second insulating layer that is electrically connected to the top electrode through the third contact hole. The first connector and the third corrector may be electrically connected to each other.

The second insulating layer and the first insulating layer may include a fourth contact hole that exposes the gate electrode.

The transistor array panel may further include a fourth connector disposed on the second insulating layer that is electrically connected to the gate electrode through the fourth contact hole.

The transistor array panel may further include a pixel electrode electrically connected to the source electrode.

The source electrode, the drain electrode, and the semiconductor may be disposed at the same layer. A boundary between the semiconductor and the source electrode or a boundary between the semiconductor and the drain electrode may each be substantially aligned with one edge of the insulator.

The semiconductor may include an oxide semiconductor.

Another embodiment of the present disclosure provides a method for manufacturing a transistor array panel, including: depositing a conductive material on a substrate and patterning the same to form a gate electrode; depositing an insulating material to form a first insulating layer; depositing a semiconductor material and patterning the same to form a semiconductor layer that overlaps the gate electrode; depositing an insulating material to form a gate insulating layer; depositing a conductive material to form a gate conductive layer; depositing a photosensitive film pattern on the gate conductive layer; etching the gate conductive layer using the photosensitive film pattern as a mask to form a top electrode; etching the gate insulating layer using the photosensitive film pattern as a mask to form an insulator; making parts of the semiconductor layer conductive to form a source electrode and a drain electrode; and electrically connecting the top electrode to the source electrode.

The method may further include using the photosensitive film pattern as a mask, an insulating material on the source electrode and the drain electrode to form a second insulating layer; and forming a first contact hole that exposes the source electrode, a second contact hole that exposes the drain electrode, and a third contact hole that exposes the top electrode, in the second insulating layer. Electrically connecting the top electrode to the source electrode may include depositing a conductive material on the second insulating layer and patterning the conductive material to form a first connector electrically connected to the source electrode through the first contact hole, a second connector electrically connected to the drain electrode through the second contact hole, and a third connector electrically connected to the top electrode through the third contact hole and electrically connected to the second connector.

The method may further include forming a fourth contact hole in the second insulating layer and the first insulating layer that exposes the gate electrode.

Patterning the conductive material may include forming a fourth connector electrically connected to the gate electrode through the fourth contact hole.

Etching the gate insulating layer may include etching a portion of the first insulating layer not covered by the semiconductor layer to make the portion thinner than a portion covered by the semiconductor.

The insulator may be formed to be thicker than the first insulating layer.

The first insulating layer may have a thickness of less than or equal to about 2,000 angstroms or less, and the insulator may have a thickness of greater than or equal to about 3,000 angstroms.

Another embodiment of the present disclosure provides a transistor array panel that includes a gate electrode; a source electrode; a drain electrode; a semiconductor; a top electrode; a first insulating layer disposed between the gate electrode and the semiconductor; and an insulator disposed between the semiconductor and the top electrode. The first insulating layer is thinner than the insulator.

The semiconductor may be disposed on the gate electrode, and the top electrode may be disposed on and overlap the semiconductor, and be electrically connected to the source electrode.

According to the exemplary embodiments of the present disclosure, the transistor properties, such as output saturation, can be improved. Further, the number of masks and processing stages used for manufacturing a transistor array panel can be reduced, and quality of the transistor array panel can be improved.

DETAILED DESCRIPTION OF THE EMBODIMENTS

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

Like reference numerals may designate like elements throughout the specification. In the drawings, the thickness or sizes of respective layers and regions may be enlarged or reduced to clearly illustrate their arrangements and relative positions.

In the specification, it will be understood that when an element such as a layer, film, region, or substrate is referred to as being "on" another element, it can be directly on the other element or intervening elements may also be present.

A transistor array panel according to an exemplary embodiment of the present disclosure will now be described with reference to accompanying drawings.

Figure 1:
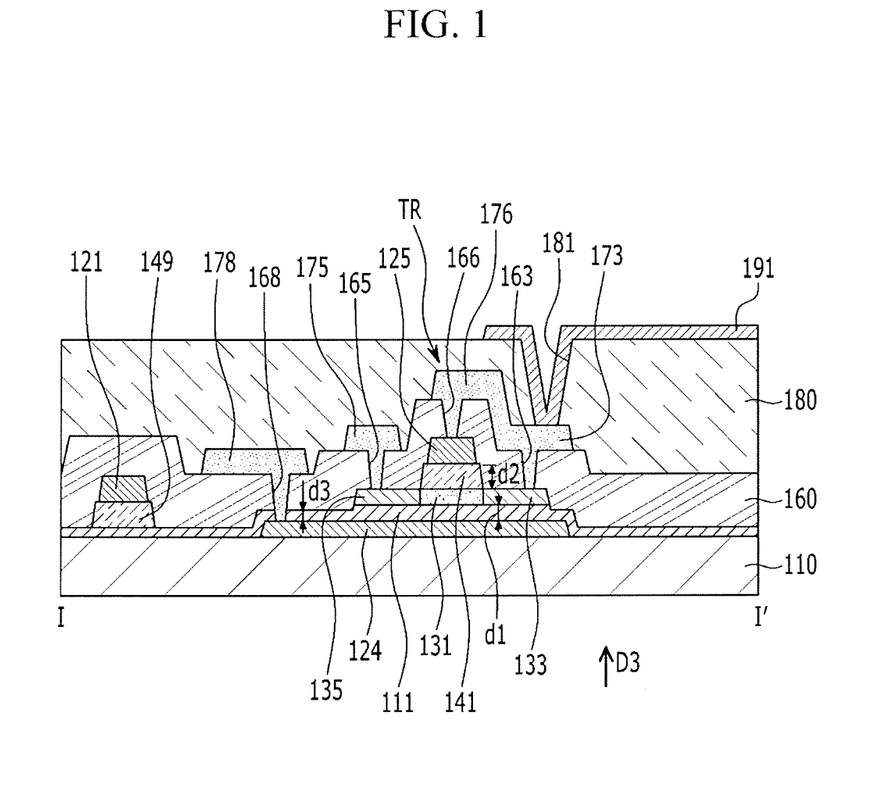
FIG. 1 is a cross-sectional view of a transistor array panel according to an exemplary embodiment of the present disclosure.
Figure 2:
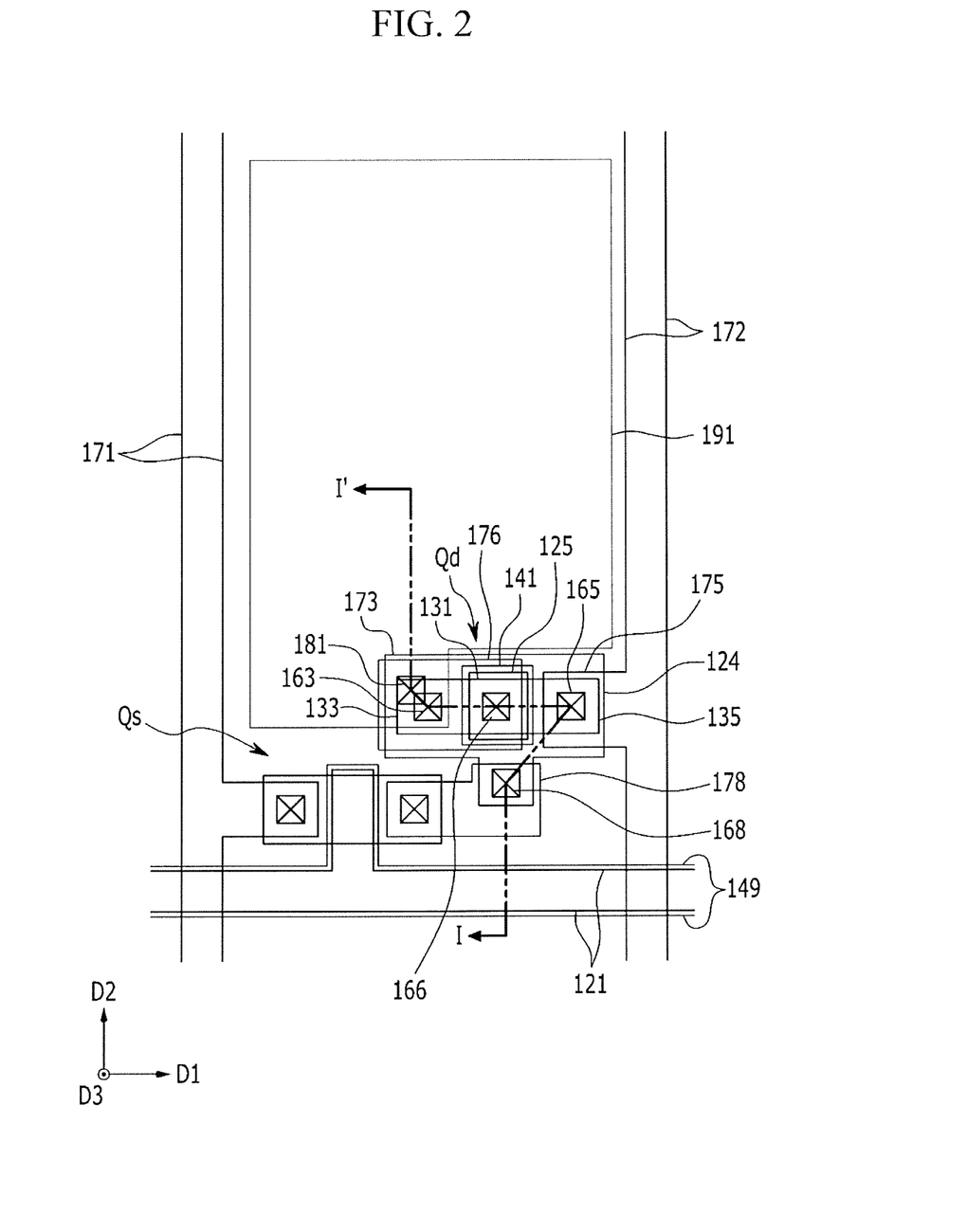
FIG. 2 is a top plan view of a transistor array panel shown in FIG. 1.

FIG. 1 is a cross-sectional view of a transistor array panel according to an exemplary embodiment of the present disclosure, and FIG. 2 is a top plan view of a transistor array panel shown in FIG. 1.

FIG. 1 is a cross-sectional view of a transistor array panel shown in FIG. 2 with respect to a line I-I', and a planar structure of a transistor array panel with the cross-sectional structure shown in FIG. 1 is not limited to FIG. 2. FIG. 2 shows part of a transistor array panel of an organic light emitting device that includes a driving transistor Qd and a switching transistor Qs, and embodiments of the present disclosure are not limited to an organic light emitting device but are applicable to other types of display devices, such as liquid crystal displays.

Referring to FIG. 1 and FIG. 2, a transistor array panel includes a substrate 110 that includes an insulating material such as plastic or glass, and a plurality of transistors TR disposed on the substrate 110. When the display device is an organic light emitting device, the transistor TR is a driving transistor Qd disposed in a pixel area. A transistor TR with the structure illustrated in FIG. 1 is not limited to the driving transistor Qd, and it may be usable as a switching transistor Qs of an organic light emitting device or a transistor of a liquid crystal display.

In the drawings, a first direction D1 and a second direction D2 are are perpendicular to each other and parallel to a plane of the top plan view of FIG. 2, and a third direction D3 is perpendicular to the first and second directions D1 and D2 and it is substantially perpendicular to the plane of the substrate 110.

According to embodiments, the transistor TR includes a gate electrode 124, a semiconductor 131, a source electrode 133, a drain electrode 135, and a top electrode 125. A first insulating layer 111 is disposed between the gate electrode 124 and the semiconductor 131, the source electrode 133, and the drain electrode 135, and an insulator 141 is disposed between the semiconductor 131 and the top electrode 125. The functions of the source electrode 133 and the drain electrode 135 are determined by the direction of a carrier current flowing through a channel of the semiconductor 131 when a gate-on voltage is applied to the gate electrode 124, and the carriers flow from the source electrode 133 to the drain electrode 135. Accordingly, when the transistor TR operates, electrons flow from the source electrode 133 to the drain electrode 135 in an n-type transistor, and holes flow from the source electrode 133 to the drain electrode 135 in a p-type transistor.

According to embodiments, the gate electrode 124 of the transistor TR is disposed on the substrate 110. The gate electrode 124 is made of a conductive material such as a metal, and may be disposed as a single layer or as multiple layers. The gate electrode 124 can function as a light blocking film. That is, the gate electrode 124 can prevent external light from reaching the semiconductor 131, and thus can hinder deterioration of the semiconductor 131 and reduce or prevent current leakage in the transistor TR. The gate electrode 124 includes a portion that overlaps the semiconductor 131, the source electrode 133, and the drain electrode 135, and a portion not overlapping the same. When the transistor TR is a driving transistor Qd, the gate electrode 124 can be electrically connected to a source electrode of the switching transistor Qs to receive a gate signal. When the transistor TR is a switching transistor Qs, the gate electrode 124 can be electrically connected to a gate line 121 to receive a gate signal.

According to embodiments, the first insulating layer 111 is disposed between the substrate 110 and the semiconductor 131 over the gate electrode 124. The first insulating layer 111 prevents an inflow of impurities into the semiconductor 131 from the substrate 110 to protect the semiconductor 131 and improve characteristics of the semiconductor 131, and may be referred to as a buffer layer. The first insulating layer 111 may be thinner than the insulator 141, and, for example, it may be about 1,000 angstroms to 2,000 angstroms thick. Regarding the first insulating layer 111, a thickness (d1) of a portion that overlaps the semiconductor 131, the source electrode 133, and the drain electrode 135 may be greater than a thickness (d3) of a portion not overlapping the same. Letting the thickness of the insulator 141 be d2, then d2>d1>d3 The first insulating layer 111 may include an inorganic insulating material such as a silicon oxide (SiOx), a silicon nitride (SiNx), aluminum oxide ($Al_2O_3$), hafnium oxide ($HfO_3$), or yttrium oxide ($Y_2O_3$). The first insulating layer 111 may be a single layer or multiple layers. For example, when the first insulating layer 111 has two layers, a lower layer may include a silicon nitride (SiNx) and an upper layer may include a silicon oxide (SiOx).

According to embodiments, the semiconductor 131, the source electrode 133, and the drain electrode 135 are disposed on the first insulating layer 111. The source electrode 133 is separated from the drain electrode 135 by the semiconductor 131 disposed therebetween. The source electrode 133 and the drain electrode 135 are disposed at the same layer as the semiconductor 131 and are connected to the semiconductor 131. A channel of the transistor TR is disposed in the semiconductor 131. When the transistor TR is a driving transistor Qd, the source electrode 133 can be electrically connected to a pixel electrode 191, and the drain electrode 135 can be electrically connected to a driving voltage line 172.

According to embodiments, the semiconductor 131, the source electrode 133, and the drain electrode 135 include a same material. For example, the semiconductor 131, the source electrode 133, and the drain electrode 135 may include the same oxide. Exemplary oxides include an oxide of metal such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. In further detail, the oxide can include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO). The semiconductor 131, the source electrode 133, and the drain electrode 135 may include a semiconductor such as polysilicon.

According to embodiments, a carrier concentration of the source electrode 133 and the drain electrode 135, which are conductors, differs from a carrier concentration of the semiconductor 131. For example, when the carrier concentration of the semiconductor 131 is less than $10^{18}/cm^3$, the carrier concentration of the source electrode 133 and the drain electrode 135 may be greater than $10^{18}/cm^3$. A gradient region in which the carrier concentration gradually changes is disposed at a boundary between the source electrode 133 and the semiconductor 131 and a boundary between the drain electrode 135 and the semiconductor 131.

According to embodiments, the source electrode 133 and the drain electrode 135 include a material generated by reducing the oxide semiconductor included in the semiconductor 131 of the transistor TR. For example, the source electrode 133 and the drain electrode 135 may further include at least one of fluorine (F), hydrogen (H), and sulfur (S) together with the oxide semiconductor included in the semiconductor 131. For example, the concentration of at least one of fluorine (F), hydrogen (H), and sulfur (S) included in the source electrode 133 and the drain electrode 135 may be greater than or equal to $10^{15}/cm^3$. Gradient regions where the concentration of the at least one of fluorine (F), hydrogen (H), and sulfur (S) changes are disposed at the boundaries between the semiconductor 131 and the source electrode 133 and drain electrode 135. The source electrode 133 and drain electrode 135 may be generated by performing a plasma process on the oxide semiconductor of the semiconductor 131 so that the oxide semiconductor becomes conductive. For example, the source electrode 133 and the drain electrode 135 may be formed by plasma-processing the oxide semiconductor in a hydrogen gas atmosphere, diffusing hydrogen into the oxide semiconductor to making it conductive.

According to embodiments, the insulator 141 is disposed on the semiconductor 131. The insulator 141 may be a single layer or multiple layers. When the insulator 141 is a single layer, it includes an insulating material such as a silicon oxide (SiOx), a silicon nitride (SiNx), a silicon oxynitride (SiON), aluminum oxide ($Al_2O_3$), hafnium oxide ($HfO_3$), or yttrium oxide ($Y_2O_3$). When the insulator 141 has multiple layers, a lower layer in contact with the semiconductor 131 includes an insulating oxide such as a silicon oxide (SiOx), aluminum oxide ($Al_2O_3$), hafnium oxide ($HfO_3$), or yttrium oxide ($Y_2O_3$) to improve the interface of the semiconductor 131 and prevent diffusion of impurities into the semiconductor 131, and at least one layer disposed to an upper portion thereof may include any of various insulating materials, such as a silicon nitride (SiNx) or a silicon oxide (SiOx). The insulator 141 may be thicker than the first insulating layer 111. For example, the thickness d2 of the insulator 141 may be greater than about 3,000 angstroms.

According to embodiments, the top electrode 125 is disposed on the insulator 141. The top electrode 125 is electrically connected to the source electrode 133. The top electrode 125 may include a metal such as copper (Cu), aluminum (Al), silver (Ag), molybdenum (Mo), chromium (Cr), tantalum (Ta), or titanium (Ti), or a metal alloy thereof. The top electrode 125 may include a conductive layer, and may include multiple layers, including at least two conductive layers made of different materials.

According to embodiments, a planar shape of the top electrode 125 in a top plan view substantially corresponds to a planar shape of the insulator 141 in the top plan view. In other words, the edges of the insulator 141 are substantially parallel to the edges of the top electrode 125. Parallel edges correspond to each other with a substantially constant gap therebetween. FIG. 1 and FIG. 2 show that the edges of the insulator 141 are disposed outward from the edges of the top electrode 125 and are parallel with edges of the gate electrode 124 with a substantially constant gap therebetween. This is because the top electrode 125 and the insulator 141 use the same photo-mask in a process for manufacturing a transistor array panel.

According to embodiments, the gate line 121 may be formed at the same layer with the same material as the top electrode 125, and an insulator 149 is disposed below the gate line 121 and formed at the same layer with the same material as the insulator 141. The gate line 121 and the top electrode 125 may be called a gate conductor, and the insulator 149 and the insulator 141 may be called a gate insulating layer. A planar shape of the gate line 121 may substantially correspond to a planar shape of the insulator 149 in a top plan view.

According to embodiments, the top electrode 125 overlaps the semiconductor 131 with the insulator 141 therebetween. The semiconductor 131 has a substantially planar shape that substantially corresponds to the planar shape of the insulator 141. That is, edges of the semiconductor 131 are substantially parallel to edges of the insulator 141. In other words, the boundary between the semiconductor 131 and the source electrode 133 and the boundary between the semiconductor 131 and the drain electrode 135 substantially correspond to the edges of the insulator 141, and may be disposed outside or inside the edges of the insulator 141, and it may be substantially aligned with the edges of the insulator 141. The insulator 141 covers substantially all of the semiconductor 131. The top electrode 125 does not substantially overlap the source electrode 133 and the drain electrode 135.

According to embodiments, a second insulating layer 160 is disposed on the transistor TR. The second insulating layer 160 may be referred to as an inter-layer insulating layer. The second insulating layer 160 includes an inorganic insulating material such as a silicon oxide (SiOx), a silicon nitride (SiNx), a silicon oxynitride (SiON), or a silicon oxyfluoride (SiOF). The second insulating layer 160 may be a single layer or multiple layers. When the second insulating layer 160 is a single layer, the second insulating layer 160 includes an inorganic insulating material such as a silicon oxide (SiOx), a silicon nitride (SiNx), a silicon oxynitride (SiON), or a silicon oxyfluoride (SiOF), and includes at least one of a silicon nitride (SiNx) and a silicon oxynitride (SiON) for supplying hydrogen (H) to the source electrode 133 and the drain electrode 135, which lowers the resistance of the source electrode 133 and the drain electrode 135. When the second insulating layer 160 has multiple layers, a lowest layer includes at least one of a silicon nitride (SiNx) and a silicon oxynitride (SiON) for supplying hydrogen (H) to the source electrode 133 and the drain electrode 135, and an intermediate layer or an upper layer that includes a silicon oxide (SiOx) is disposed on the lowest layer. When the second insulating layer 160 has multiple layers, another layer that includes a material such as a silicon nitride (SiNx) or a silicon oxynitride (SiON) may be further disposed on the intermediate layer.

According to embodiments, when an oxide semiconductor material is deposited on the substrate 110, the source electrode 133 and the drain electrode 135 become conductive by plasma processing. In particular, hydrogen in a gas used to form the second insulating layer 160 may diffuse into the oxide semiconductor material to lower its resistance. The gas may include silane ($SiH_4$) or ammonia ($NH_3$). Alternatively, hydrogen included in the second insulating layer 160 may diffuse into the oxide semiconductor material to lower its resistance after the second insulating layer 160 is formed. The source electrode 133 and the drain electrode 135 may also be doped with a component of an etching gas used to pattern the insulator 141, which lowers their resistance.

According to embodiments, the second insulating layer 160 includes a first contact hole 163 for exposing the source electrode 133, a second contact hole 165 for exposing the drain electrode 135, and a third contact hole 166 for exposing the top electrode 125. The second insulating layer 160 and the first insulating layer 111 also include a fourth contact hole 168 for exposing the gate electrode 124. At least one of the first to fourth contact holes 163, 165, 166, and 168 may be omitted depending on the type of the transistor TR.

According to embodiments, a data conductor that includes a first connector 173, a second connector 175, and a third connector 176 is disposed on the second insulating layer 160. The first connector 173 is connected to the source electrode 133 through the contact hole 163 of the second insulating layer 160, and the second connector 175 is connected to the drain electrode 135 of the transistor TR through the second contact hole 165 of the second insulating layer 160. The third connector 176 is connected to the top electrode 125 through the third contact hole 166 of the second insulating layer 160, and is also connected to the first connector 173. By these connections, the top electrode 125 is electrically connected to the source electrode 133. The data conductor further includes a fourth connector 178 electrically connected to the gate electrode 124 through the fourth contact hole 168 that transmits a signal to the gate electrode 124. At least one of the first to fourth connectors 173, 175, 176, and 178 may be omitted depending on the type of the transistor TR.

According to embodiments, the data conductor further includes a data line 171 and a driving voltage line 172. The data conductor is made of a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof. The data conductor includes a conductive layer, and may include multiple layers, including at least two conductive layers made of different materials.

According to embodiments, a passivation layer 180 is disposed on the second insulating layer 160 and the data conductor. The passivation layer 180 includes at least one of an inorganic insulating material and an organic insulating material, and may include a single layer or multiple layers. An upper side of the passivation layer 180 is substantially flat. The passivation layer 180 includes a contact hole 181 for exposing one of the first connector 173 and the third connector 176.

According to embodiments, the pixel electrode 191 is disposed on the passivation layer 180. The pixel electrode 191 is electrically connected to the first connector 173 or the third connector 176 through the contact hole 181. Accordingly, the pixel electrode 191 is electrically connected to the source electrode 133 of the transistor TR and can receive a data voltage. The pixel electrode 191 includes a transparent conductive material such as indium tin oxide (ITO) or indium zinc oxide (IZO).

According to the present exemplary embodiment, the top electrode 125 of the transistor TR is electrically connected to the source electrode 133, so a source voltage of the source electrode 133 can be applied to the top electrode 125. When the source voltage is applied to the top electrode 125, a current slope is reduced in a saturation region of a voltage-current characteristic graph of the transistor TR, which can improve output saturation characteristics of the transistor TR. Improved output saturation characteristics means that, for example, the output current of the transistor TR becomes less sensitive to voltage variations of the source electrode 133 caused by degradation of elements, such as a light-emitting device connected to the transistor TR. Therefore, a transistor TR according to a present exemplary embodiment may be used as a driving transistor of a display device, such as an organic light emitting device, and may be used for configuring an external current sensing circuit.

According to a present exemplary embodiment, the first insulating layer 111 disposed between the gate electrode 124 and the semiconductor 131 is thinner than the insulator 141 disposed between the semiconductor 131 and the top electrode 125, that is, d1<d2. Therefore, capacitance between the top electrode 125 and the semiconductor 131 may be controlled to be less than capacitance between the gate electrode 124 and the semiconductor 131, thereby preventing a decrease of mobility caused by an electric field induced between the top electrode 125 and the semiconductor 131. Further, the increased thickness of the insulator 141 can prevent short circuits between the semiconductor 131 and the top electrode 125.

According to other embodiments, the top electrode 125 can be electrically disconnected from the source electrode 133 and instead configured to receive a bias. This can improve the output saturation characteristic of the transistor TR by applying a fixed bias to the upper side of the semiconductor 131. For example, the output current may be less influenced by variations of the source voltage or the drain voltage in the saturation region of the transistor TR. According to other embodiments, the top electrode 125, rather than being electrically connected to the source electrode 133 or receiving a bias, can electrically float.

A method for manufacturing a transistor array panel shown in FIG. 1 according to an exemplary embodiment will now be described with reference to FIG. 3 to FIG. 8.

FIG. 3 to FIG. 8 show processing cross-sectional views of a method for manufacturing a transistor array panel according to an exemplary embodiment of the present disclosure.

Figure 3:
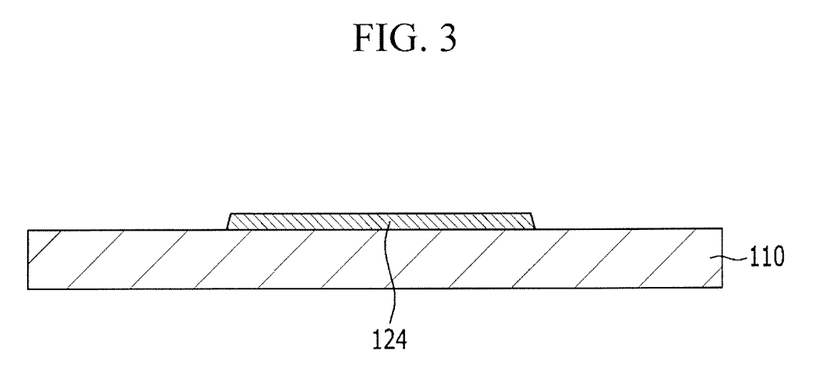
FIG. 3 to FIG. 8 show processing cross-sectional views of a method for manufacturing a transistor array panel according to an exemplary embodiment of the present disclosure.

Referring to FIG. 3, a conductive material such as a metal is deposited on the substrate 110 through a sputtering process, and is patterned thereon using a photosensitive material such as a photoresist and a first mask to generate a gate electrode 124. The gate electrode 124 can function as a light blocking film.

Figure 4:
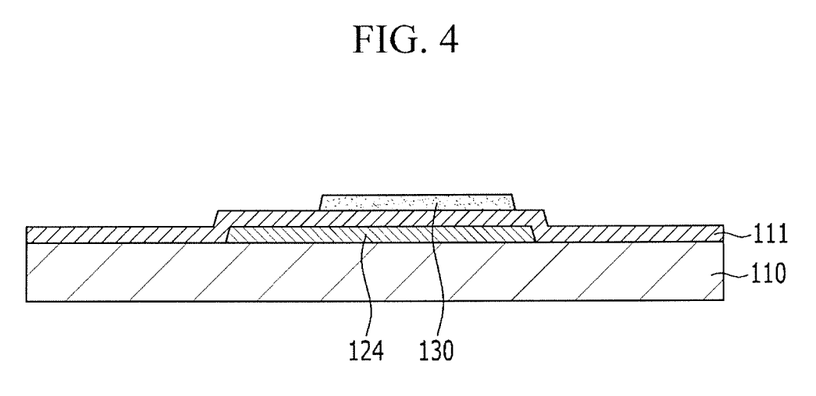

Referring to FIG. 4, an inorganic insulating material such as a silicon oxide (SiOx), a silicon nitride (SiNx), aluminum oxide ($Al_2O_3$), hafnium oxide ($HfO_3$), or yttrium oxide ($Y_2O_3$) is deposited on the substrate 110 over the gate electrode 124 through chemical vapor deposition (CVD) to generate a first insulating layer 111. The first insulating layer 111 can function as a buffer layer.

An oxide semiconductor material such as a zinc oxide (ZnO), a zinc-tin oxide (ZTO), a zinc-indium oxide (ZIO), an indium oxide (InO), a titanium oxide (TiO), an indium-gallium-zinc oxide (IGZO), or an indium-zinc-tin oxide (IZTO) is deposited on the first insulating layer 111 through chemical vapor deposition, and it is patterned using a second mask to generate a semiconductor layer 130.

Figure 5:
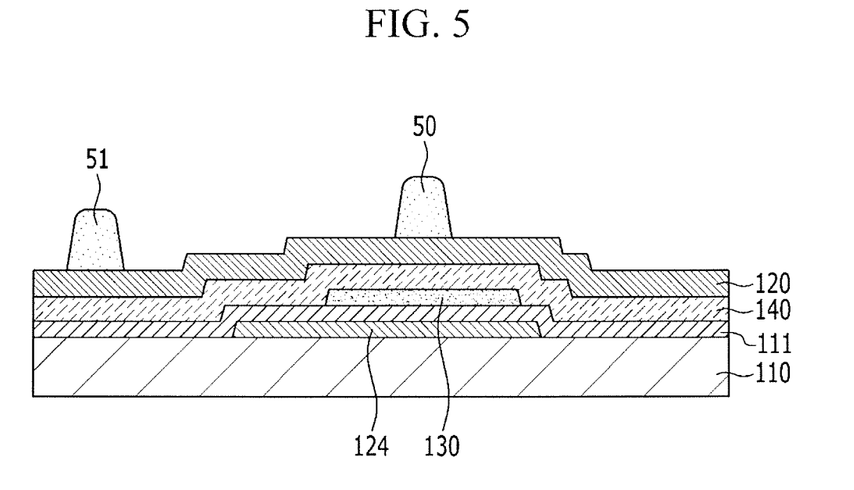

Referring to FIG. 5, an inorganic insulating material such as a silicon oxide (SiOx), a silicon nitride (SiNx), or a silicon oxynitride (SiON) is deposited on the substrate 110 over the semiconductor layer 130 through chemical vapor deposition to generate a gate insulating layer 140. A conductive material such as a metal is deposited on the gate insulating layer 140 through sputtering to generate a gate conductive layer 120. The gate conductive layer 120 may be thicker than the first insulating layer 111. For example, the first insulating layer 111 may be about 1,000 angstroms to 2,000 angstroms thick, and the gate conductive layer 120 may be greater than or equal to about 3,000 angstroms thick. The gate conductive layer 120 is formed thicker to prevent short circuits between the semiconductor layer 130 and the top electrode 125 during subsequent etching processes of the gate conductive layer 120.

A photosensitive material is deposited on the gate conductive layer 120, and photosensitive film patterns 50 and 51 are generated using a third mask.

Figure 6:
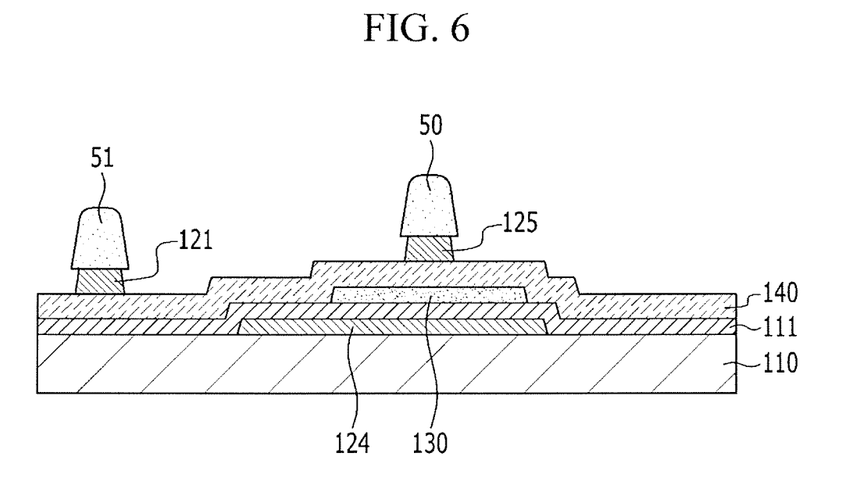

Referring to FIG. 6, the gate conductive layer 120 is etched using the photosensitive film patterns 50 and 51 as masks to generate a top electrode 125 and a gate line 121. Here, the gate conductive layer 120 can be etched by wet etching or dry etching.

Figure 7:
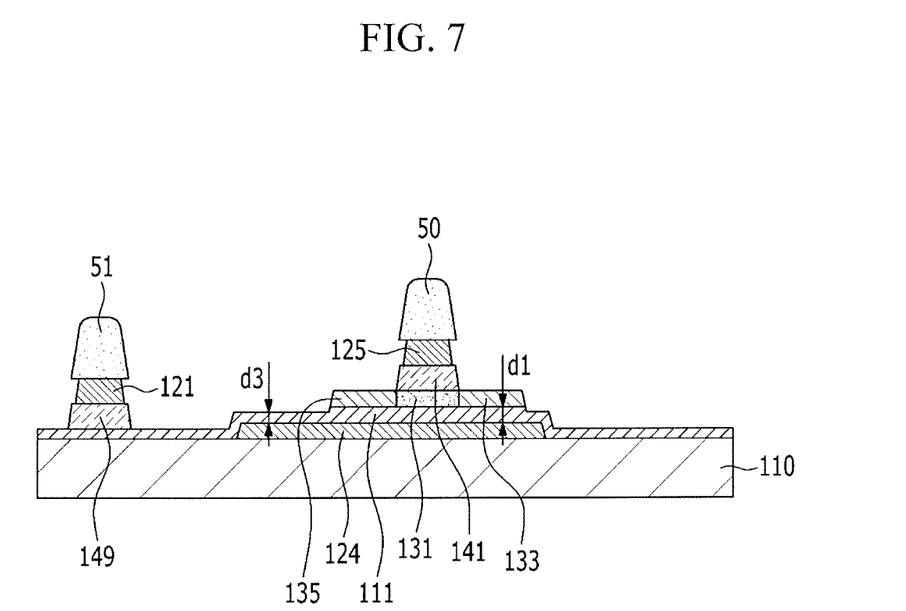

Referring to FIG. 7, the gate insulating layer 140 is etched using the photosensitive film patterns 50 and 51 as masks to generate insulators 141 and 149, after which photosensitive film patterns 50 and 51 are removed. Here, the gate insulating layer 140 can be etched by dry etching. During the process, a component of the etching gas, such as SF6, may diffuse into a portion of the semiconductor layer 130 not covered by the photosensitive film patterns 50 and 51 and the insulator 141, which reduces resistance of the exposed portion of the semiconductor layer 130. Accordingly, the portion of semiconductor layer covered by the insulator 141 remains the semiconductor 131 and the rest thereof becomes conductive to generate the source electrode 133 and the drain electrode 135. However, most of the semiconductor layer maintain a semiconducting characteristic during the patterning process of the gate insulator 141.

During the process for etching the gate insulating layer 140, if the gate insulating layer 140 is over-etched, a portion of the first insulating layer 111 not covered by the semiconductor layer 130 is etched to become thinner, to have a thickness d3 that is less than a thickness d1 of the first insulating layer 111 covered by the semiconductor layer 130. In this case, the semiconductor layer 130 functions as a mask so that the first insulating layer 111 may be etched thinner. In the process of etching the gate insulating layer 140, a portion of the first insulating layer 111 not covered by the semiconductor layer 130 may be removed to expose the gate electrode 124 and portions of the substrate 110 not covered by the semiconductor layer 130.

The source electrode 133 and the drain electrode 135 can be generated by additionally processing portions of the semiconductor layer 130 not covered by the insulator 141. The processing method in this instance may include a heat treatment in a reducing atmosphere, and a plasma processing method that uses a gas plasma such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), or fluoroform ($CHF_3$). Those portions of the semiconductor layer 130 covered by the insulator 141 become the semiconductor 131, and remain semi-conducting.

Figure 8:
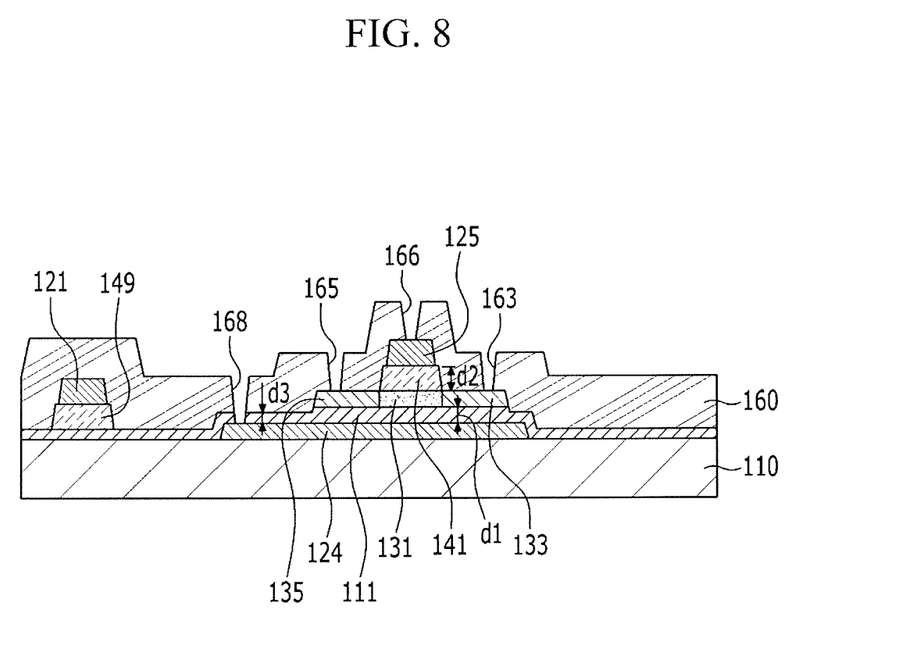

Referring to FIG. 8, an inorganic insulating material such as a silicon oxide (SiOx), a silicon nitride (SiNx), or a silicon oxynitride (SiON) is deposited on the substrate 110 over the top electrode 125 through chemical vapor deposition to generate a single-layered or multilayered second insulating layer 160. A component, such as hydrogen, in the gas, such as $SiH_4$ or $NH_3$, used for film-forming the second insulating layer 160 diffuses into portions of the semiconductor layer 130 not covered by the insulator 141, such as the source electrode 133 and the drain electrode 135, to lower their resistance. After the second insulating layer 160 is film-formed, the component can diffuse into the source electrode 133 and drain electrode 135 to lower their resistance.

The second insulating layer 160 is patterned using a fourth mask to generate a first contact hole 163 for exposing the source electrode 133, a second contact hole 165 for exposing the drain electrode, a third contact hole 166 for exposing the top electrode 125, and a fourth contact hole 168 that penetrates the second insulating layer 160 and the first insulating layer 111 to expose the gate electrode 124. The first insulating layer 111 is relatively thin so that the fourth contact hole 168 can be generated together with the first to third contact holes 163, 165, and 166 in same the etching process. Further, when the gate insulating layer 140 is etched, a portion of the first insulating layer 111 not covered by the semiconductor layer 130 is partly etched to become thinner so it may be more easily penetrated to generate the fourth contact hole 168. Therefore, the first to fourth contact holes 163, 165, 166, and 168 that expose constituent elements at different layers can be formed through a single etching using a single mask so that the number of masks, processing stages and processing distributions can be reduced. At least one of the first to fourth contact holes 163, 165, 166, and 168 may be omitted, depending on the type of the transistor.

Referring to FIG. 1, a conductive material such as a metal is deposited on the second insulating layer 160 through sputtering and is patterned using a fifth mask to generate a plurality of data conductors that include the first connector 173, the second connector 175, the third connector 176, and the fourth connector 178. The first connector 173 is connected to the third connector 176. Therefore, the top electrode 125 can be electrically connected to the source electrode 133. At least one of the first to fourth connectors 173, 175, 176, and 178 may be omitted, depending on the type of the transistor.

Display devices that include a transistor array panel according to an exemplary embodiment of the present disclosure will now be described with reference to FIG. 9 and FIG. 10.

Figure 9:
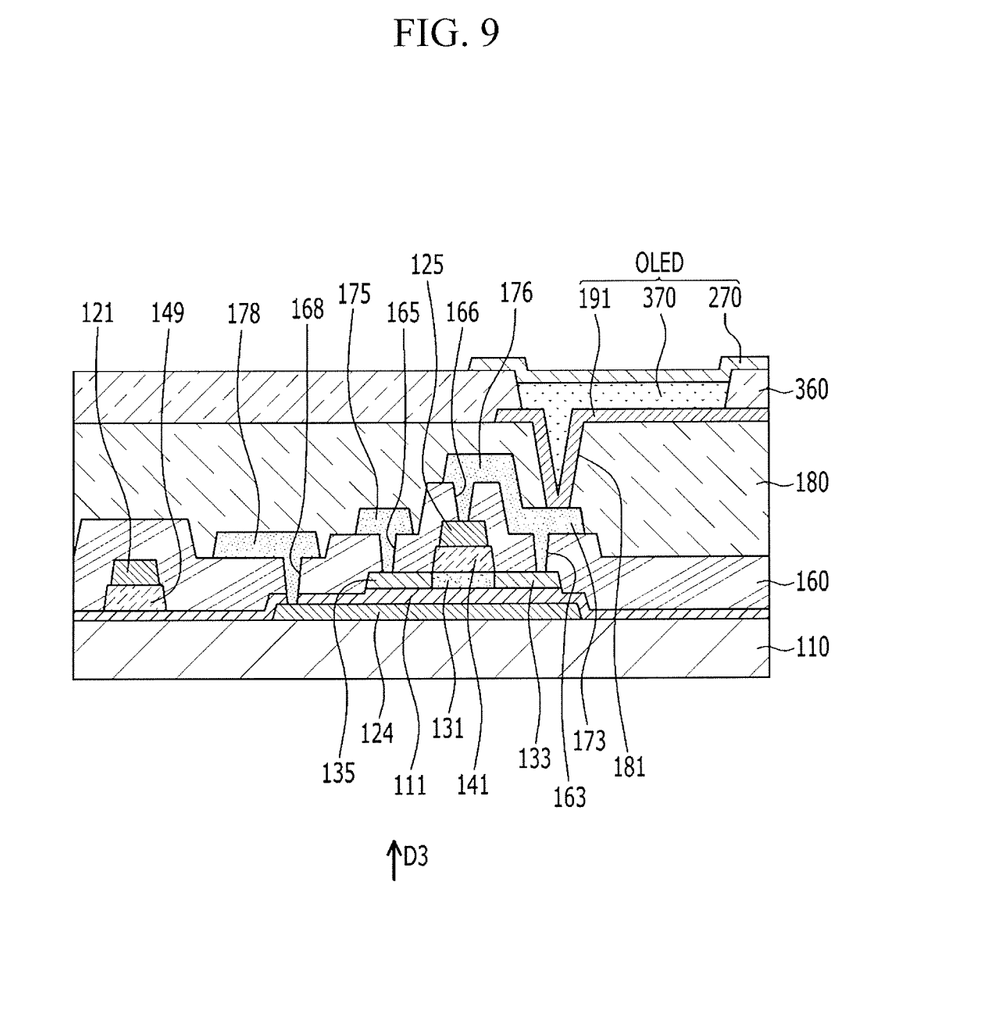
FIG. 9 is a cross-sectional view of a display device that includes a transistor array panel according to an exemplary embodiment of the present disclosure.

FIG. 9 is a cross-sectional view of a display device that includes a transistor array panel according to an exemplary embodiment of the present disclosure.

A display device according to a present exemplary embodiment is an organic light emitting diode device, and includes a transistor array panel according to an above-described exemplary embodiment. Description of above-described constituent elements will be omitted.

According to an embodiment, a pixel definition layer 360 is disposed on the passivation layer 180 and the pixel electrode 191. The pixel definition layer 360 includes an opening for exposing the pixel electrode 191. The pixel definition layer 360 may include resins such as polyacrylics or polyimides or an inorganic material such as silica.

According to an embodiment, an emission layer 370 is disposed on the pixel electrode 191, and a common electrode 270 is disposed on the emission layer 370 in the opening of the pixel definition layer 360. The pixel electrode 191, the emission layer 370, and the common electrode 270 configure an organic light emitting diode (OLED). The pixel electrode 191 may be an anode of the organic light emitting diode (OLED), and the common electrode 270 may be a cathode of the organic light emitting diode (OLED).

According to an embodiment, light output by the emission layer 370 can propagate through the substrate 110 directly or after a plurality of reflections, and may be output from a lower portion of the substrate 110, or may be output from an upper portion of the substrate 110 without propagating through the substrate 110.

According to an embodiment, an encapsulation layer that protects the organic light emitting diode (OLED) may be disposed on the common electrode 270.

Figure 10:
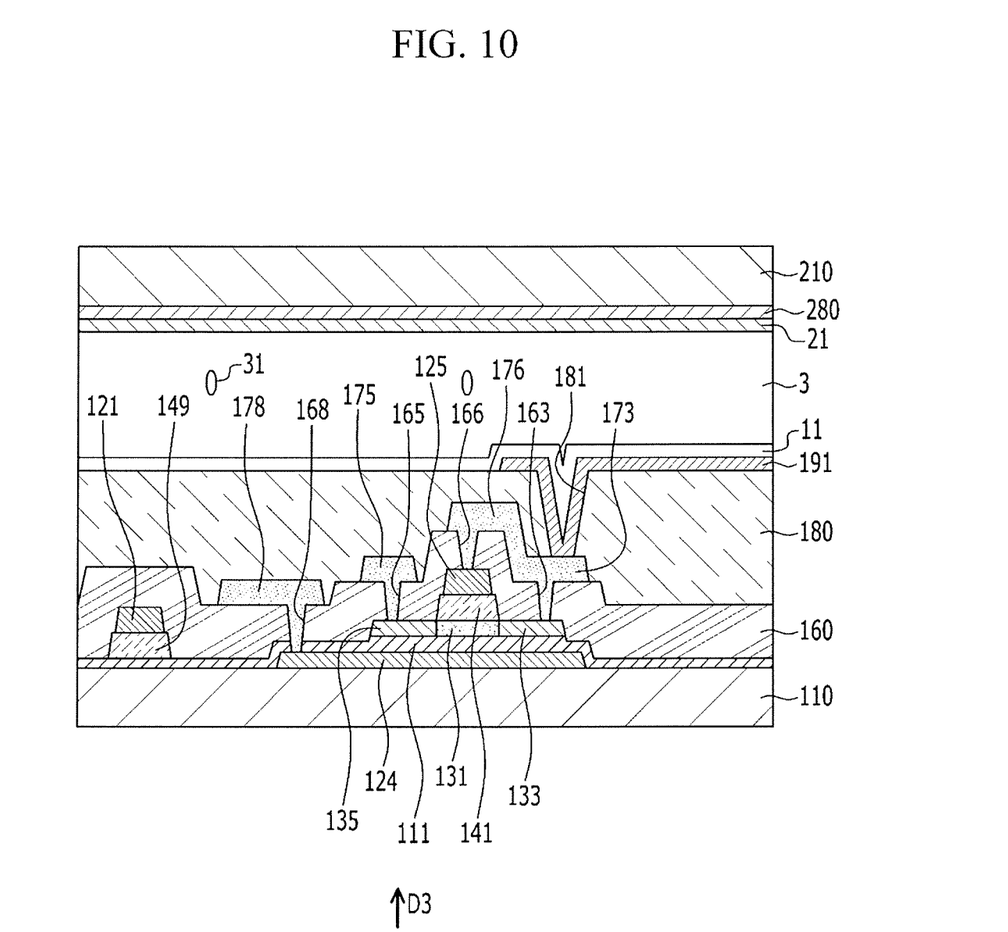
FIG. 10 is a cross-sectional view of a display device that includes a transistor array panel according to an exemplary embodiment of the present disclosure.

FIG. 10 is a cross-sectional view of a display device that includes a transistor array panel according to an exemplary embodiment of the present disclosure.

A display device according to a present exemplary embodiment is a liquid crystal display, and it includes a transistor array panel according to an above-described exemplary embodiment. The above-described constituent elements will be omitted.

According to an embodiment, a liquid crystal layer 3 that includes liquid crystal molecules 31 is disposed on the pixel electrode 191.

According to an embodiment, an insulating layer 210 that seals the liquid crystal layer 3 together with the substrate 110 is disposed on the liquid crystal layer 3. The insulating layer 210 is shaped like the substrate.

According to an embodiment, an opposite electrode 280 that generates an electric field in the liquid crystal layer 3 together with the pixel electrode 191 and controls an alignment direction of the liquid crystal 31 is disposed above or below the insulating layer 210. Alternatively, the opposite electrode 280 may be disposed between the substrate 110 and the liquid crystal layer 3. The opposite electrode 280 includes a transparent conductive material such as an ITO or an IZO. A common voltage can be applied to the opposite electrode 280.

According to an embodiment, alignment layers 11 and 21 can be disposed between the liquid crystal layer 3 and the insulating layer 210 and between the liquid crystal layer 3 and the pixel electrode 191. The alignment layers 11 and 21 control the initial alignment of the liquid crystal molecules 31 before the electric field is generated in the liquid crystal layer 3. The alignment layers 11 and 21 contact the liquid crystal layer 3.

According to an embodiment, a display device according to a present exemplary embodiment further includes a backlight for supplying light, since a liquid crystal display is a non-emissive display device. The backlight may be disposed below the substrate 110.

In addition, a transistor array panel according to an exemplary embodiment of the present disclosure may be included in various kinds of display devices.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A transistor array panel, comprising
a transistor disposed on a substrate,
wherein the transistor includes a gate electrode, a source electrode, a drain electrode, a semiconductor, and a top electrode,
wherein the top electrode is disposed on and overlaps the semiconductor, and is electrically connected to the source electrode,
wherein the source electrode, the drain electrode, and the semiconductor are part of a same layer, and
wherein the top electrode does not overlap the source electrode and the drain electrode,
wherein the transistor array panel further comprises
a first insulating layer disposed between the gate electrode and the semiconductor;
a second insulating layer disposed on the transistor and that covers the top electrode;
a first connector disposed on the second insulating layer and electrically connected to the source electrode;

a second connector disposed on the second insulating layer and electrically connected to the drain electrode;

a third connector disposed on the second insulating layer and electrically connected to the top electrode;

a third insulating layer disposed on the first connector, the second connector, and the third connector; and a pixel electrode disposed on the third insulating layer and electrically connected to the source electrode, wherein the first connector, the second connector, and the third connector are part of a same layer that is separate from a layer of the pixel electrode and a layer of the top electrode, wherein the first connector and the third connector are physically and electrically connected to each other, and wherein the top electrode and the source electrode are electrically connected to each other by the first connector and the third connector, which are disposed between the second insulating layer and the third insulating layer.

2. The transistor array panel of claim 1, wherein the semiconductor is disposed on the gate electrode.

3. The transistor array panel of claim 2, further comprising:

an insulator disposed between the semiconductor and the top electrode, wherein the first insulating layer is thinner than the insulator.

4. The transistor array panel of claim 3, wherein the first insulating layer has a thickness of less than or equal to about 2,000 angstroms, and the insulator has a thickness of greater than or equal to about 3,000 angstroms.

5. The transistor array panel of claim 3, further comprising wherein the second insulating layer includes a first contact hole that exposes the source electrode, a second contact hole that exposes the drain electrode, and a third contact hole that exposes the top electrode.

6. The transistor array panel of claim 5, wherein the first connector is electrically connected to the source electrode through the first contact hole, the second connector is electrically connected to the drain electrode through the second contact hole, and the third connector is electrically connected to the top electrode through the third contact hole.

7. The transistor array panel of claim 5, wherein the second insulating layer and the first insulating layer include a fourth contact hole that exposes the gate electrode.

8. The transistor array panel of claim 7, further comprising a fourth connector disposed on the second insulating layer that is electrically connected to the gate electrode through the fourth contact hole.

9. The transistor array panel of claim 3, wherein a boundary between the semiconductor and the source electrode and a boundary between the semiconductor and the drain electrode are each substantially aligned with one edge of the insulator.

10. The transistor array panel of claim 1, wherein the semiconductor includes an oxide semiconductor.

11. The transistor array panel of claim 1, wherein the third insulating layer is in direct contact with the first connector, the second connector, and the third connector.

* * * * *